US009269663B2

(12) United States Patent
Keller et al.

(10) Patent No.: US 9,269,663 B2
(45) Date of Patent: Feb. 23, 2016

(54) SINGLE PATTERN HIGH PRECISION CAPACITOR

(71) Applicant: Texas Instruments Incorporated, Dallas, TX (US)

(72) Inventors: Stephen Alan Keller, Plano, TX (US); Michael LeRoy Huber, Sachse, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/077,497

(22) Filed: Nov. 12, 2013

(65) Prior Publication Data

US 2014/0159201 A1     Jun. 12, 2014

Related U.S. Application Data

(60) Provisional application No. 61/734,289, filed on Dec. 6, 2012.

(51) Int. Cl.
*H01L 29/94* (2006.01)
*H01L 23/522* (2006.01)
*H01L 49/02* (2006.01)

(52) U.S. Cl.
CPC ............ *H01L 23/5223* (2013.01); *H01L 28/91* (2013.01); *H01L 2924/0002* (2013.01)

(58) Field of Classification Search
CPC .................. H01L 21/76802; H01L 21/76834; H01L 28/75
USPC .......................... 438/387, 655; 257/306, 752
See application file for complete search history.

(56) References Cited

U.S. PATENT DOCUMENTS

| | | | |
|---|---|---|---|
| 2003/0228764 A1* | 12/2003 | Khan et al. ................... 438/692 |
| 2005/0156278 A1* | 7/2005 | Coolbaugh et al. ........... 257/532 |
| 2006/0157766 A1* | 7/2006 | Won et al. ..................... 257/296 |
| 2006/0164876 A1* | 7/2006 | Barth et al. ..................... 365/46 |
| 2006/0189069 A1* | 8/2006 | Coolbaugh et al. ........... 438/243 |

* cited by examiner

*Primary Examiner* — Thomas L Dickey
(74) *Attorney, Agent, or Firm* — Jacqueline J. Garner; Frank D. Cimino

(57) ABSTRACT

An integrated circuit contains a high precision capacitor having a bottom plate, a dielectric layer over the bottom plate, a capacitor opening in the dielectric layer exposing, and not overlapping, the bottom plate, a capacitor dielectric layer covering sidewalls and a bottom of the capacitor opening, a top plate covering the capacitor dielectric layer in the capacitor opening, and a capacitor planarizing dielectric layer covering the capacitor top plate in the capacitor opening. A top surface of the capacitor planarizing dielectric layer and a top edge of the capacitor top plate are substantially coplanar. The top plate does not extend laterally beyond the capacitor opening. A method of forming the integrated circuit the high precision capacitor is also disclosed.

18 Claims, 15 Drawing Sheets

SINGLE PATTERN HIGH PRECISION CAPACITOR

CROSS-REFERENCE TO RELATED APPLICATIONS

This application claims the benefit of priority under U.S.C. §119(e) of U.S. Provisional Application 61/734,289.

FIELD OF THE INVENTION

This invention relates to the field of integrated circuits. More particularly, this invention relates to a high precision capacitor that may be added to an integrated circuit (IC) capacitor with one additional photo resist masking step.

BACKGROUND OF THE INVENTION

High precision capacitors are often needed in integrated circuits. For example, some of the capacitor requirements in a true eighteen bit analog-to digital or digital-to-analog converter are a ratio stability of less than 0.00075% over 10 years, a voltage coefficient of less than 10 ppm per volt, a temperature drift match of less than 0.05% per ° C., a dielectric absorption of less than 0.00075%, and a capacitance of greater than 0.5 femtofarads per square micrometer.

Such integrated circuit capacitors are generally formed as part of a fabrication process whereby a thin dielectric layer is established between two metallic plates. For example, a thin dielectric layer may be established between a bottom plate formed from silicided polysilicon gate material and a top plate of a deposited metal, or a thin dielectric layer may be established between a bottom plate of interconnect material and a top plate of a deposited metal. A crucial step in manufacturing high precision integrated circuit capacitors is the formation of the capacitor plates. In manufacturing the capacitors, the capacitor plates are typically formed by etching one or more conductive layers to a desired shape. Current etch techniques may limit the precision of the capacitors so formed by producing nonlinear etch profiles, by leaving filaments of the material being etched, by trenching the surface of underlying layers, and by damaging the capacitor dielectric along the edges of the capacitor. There is therefore a need for a method to form high precision integrated circuit capacitors that is not limited by conventional etching constraints.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit contains a high precision capacitor having a bottom plate, a dielectric layer over the bottom plate, a capacitor opening in the dielectric layer exposing, and not overlapping, the bottom plate, a capacitor dielectric layer covering sidewalls and a bottom of the capacitor opening, a top plate covering the capacitor dielectric layer in the capacitor opening, and a capacitor planarizing dielectric layer covering the capacitor top plate in the capacitor opening. A top surface of the capacitor planarizing dielectric layer and a top edge of the capacitor top plate are substantially coplanar. The top plate does not extend laterally beyond the capacitor opening. A method of forming the integrated circuit the high precision capacitor is also disclosed.

Figure 1:
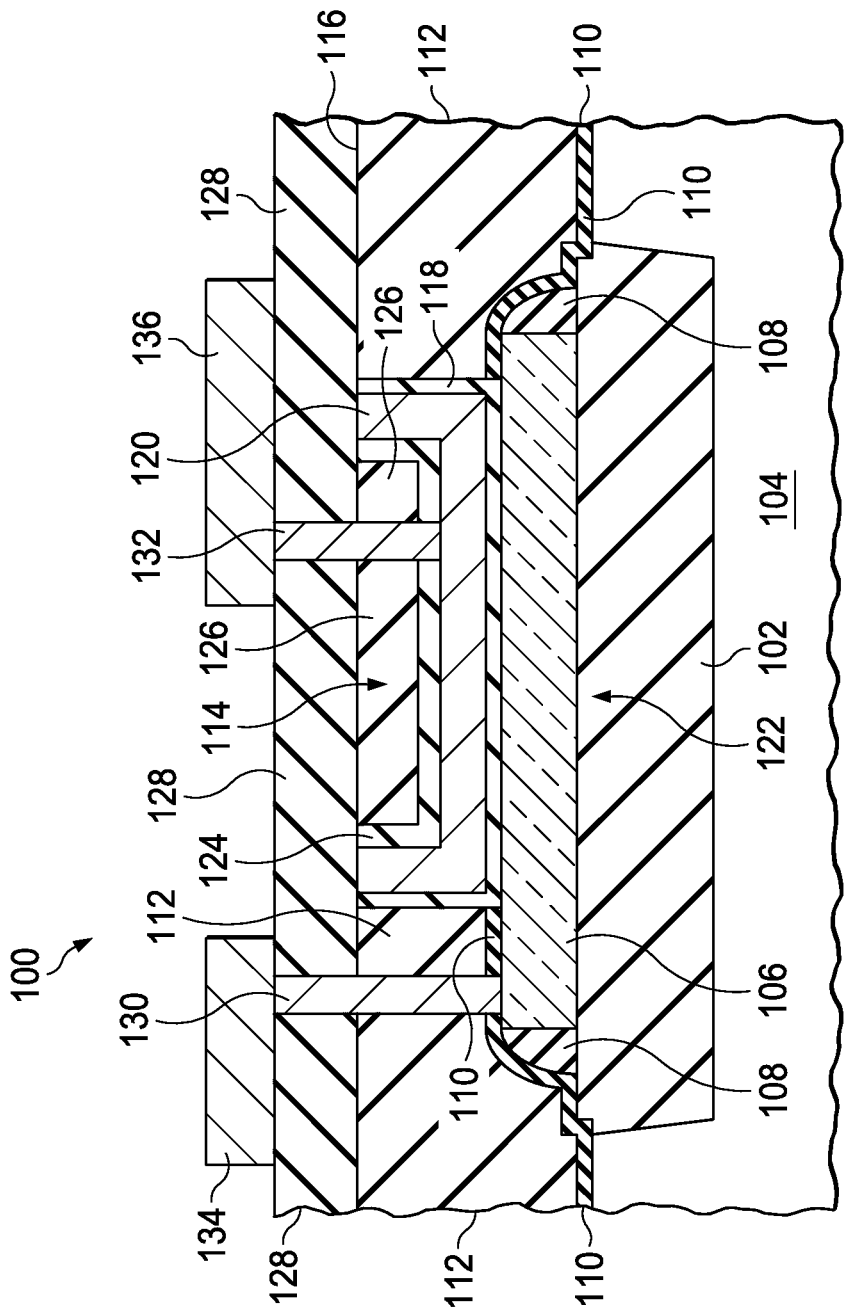
FIG. 1 shows an integrated circuit containing an exemplary high precision capacitor.

An exemplary method for forming the integrated circuit of FIG. 1 is illustrated in FIG. 2A through FIG. 2D.

Several options that are illustrated in FIG. 3 through FIG. 6 are available for making connections between a first interconnect layer and the high precision capacitor.

FIG. 7A through FIG. 7F show another integrated circuit containing an exemplary high precision capacitor, depicted in successive stages of fabrication.

FIG. 8A through FIG. 8F show a further integrated circuit containing an exemplary high precision capacitor, depicted in successive stages of fabrication.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows an integrated circuit containing an exemplary high precision capacitor. The integrated circuit 100 includes field oxide 102 disposed in a substrate 104. A bottom plate 106 is disposed over the field oxide 102. In the instant example, the bottom plate 106 includes a layer of polycrystalline silicon, commonly referred to as polysilicon, 50 nanometers to 1000 nanometers thick, possibly with a layer of metal silicide on the layer of polysilicon. The metal silicide may include, for example, titanium silicide, tungsten silicide, platinum silicide, cobalt silicide, molybdenum silicide or nickel silicide. Dielectric sidewalls 108 may be present on lateral surfaces of the bottom plate 106.

An optional pre-metal dielectric (PMD) liner 110 may be disposed over the bottom plate 106. The PMD liner 110 may include, for example 10 nanometers to 100 nanometers of silicon nitride. The PMD liner 110 may possibly be a dual stress liner (DSL) layer. A PMD layer 112 is disposed over the PMD liner 110. The PMD layer 112 may include, for example, boron phosphorus silicate glass (BPSG). A top surface of the PMD layer 112 may be, for example, 100 nanometers to 2000 nanometers above the top surface of the substrate 104.

A capacitor opening 114 in the PMD layer 112 and the PMD liner 110 extends from the top surface 116 of the PMD layer 112 to the bottom plate 106, so that the bottom plate 106 is free of the PMD layer 112 and the PMD liner 110 in the capacitor opening 114. The bottom plate 106 extends past the capacitor opening 114 on all sides so that the capacitor opening 114 is surrounded by the bottom plate 106. A capacitor dielectric layer 118 is disposed in the capacitor opening 114 on sidewalls of the capacitor opening 114 extending to a top of the capacitor opening 114 and on the bottom plate 106 exposed by the capacitor opening 114. The capacitor dielectric layer 118 may include, for example, one or more layers of silicon dioxide, silicon nitride, silicon oxynitride, tantalum pentoxide, aluminum oxide, zirconium oxide, and/or hafnium oxide, with a total thickness of 10 nanometers to 60 nanometers.

A top plate 120 is disposed in the capacitor opening 114 on the capacitor dielectric layer 118. The top plate 120 may include, for example, one or more layers of titanium, titanium nitride, tantalum, tantalum nitride, titanium tungsten and/or tungsten, with a total thickness of 20 nanometers to 100 nanometers. The bottom plate 106, the capacitor dielectric layer 118 and the top plate 120 provide the high precision capacitor 122. Lateral dimensions of the high precision capacitor 122 are controlled by a photolithographic process used to define lateral dimensions of the capacitor opening 114 and by an etch process used to form the capacitor opening 114, which may advantageously provide more precision compared to capacitors with other configurations. In addition, issues with variation in capacitor area due to nonlinear etch profiles on the sides of the capacitor plate, issues in capacitance variation due to conductive etch residue filaments, and issues with etch damage to the capacitor dielectric are avoided.

An optional etch stop layer 124 may be disposed on the top plate 120. The etch stop layer 124 may include, for example, silicon nitride, silicon carbide or amorphous carbon, with a total thickness of 5 nanometers to 20 nanometers.

The capacitor dielectric layer 118, the top plate 120 and the optional etch stop layer 124 extend to the top surface 116 of the PMD layer 112. A capacitor planarization layer 126 is disposed in the capacitor opening 114 over the top plate 120. The capacitor planarization layer 126 may include, for example, 100 nanometers to 2000 nanometers of BPSG.

A top surface of the capacitor planarization layer 126 and top edges of the top plate 120 and the etch stop layer 124 are substantially coplanar. The top plate 120 does not extend laterally beyond the capacitor opening 114.

An optional PMD cap layer 128 may be disposed over the PMD layer 112 and the high precision capacitor 122. Electrical connections to the bottom plate 106 and the top plate 120 may be accomplished with several different structures. The instant example includes one version of the electrical connections. A first contact 130 is disposed through the optional PMD cap layer 128 if present and through the PMD layer 112 and the optional PMD liner 110 if present to make an electrical connection to the bottom plate 106. A second contact 132 is disposed through the PMD cap layer 128 if present, the capacitor planarization layer 126 and the optional etch stop layer 124 if present to make an electrical connection to the top plate 120. A first interconnect 134 is disposed on the first contact 130 and a second interconnect 136 is disposed on the second contact 132.

Figure 2A:
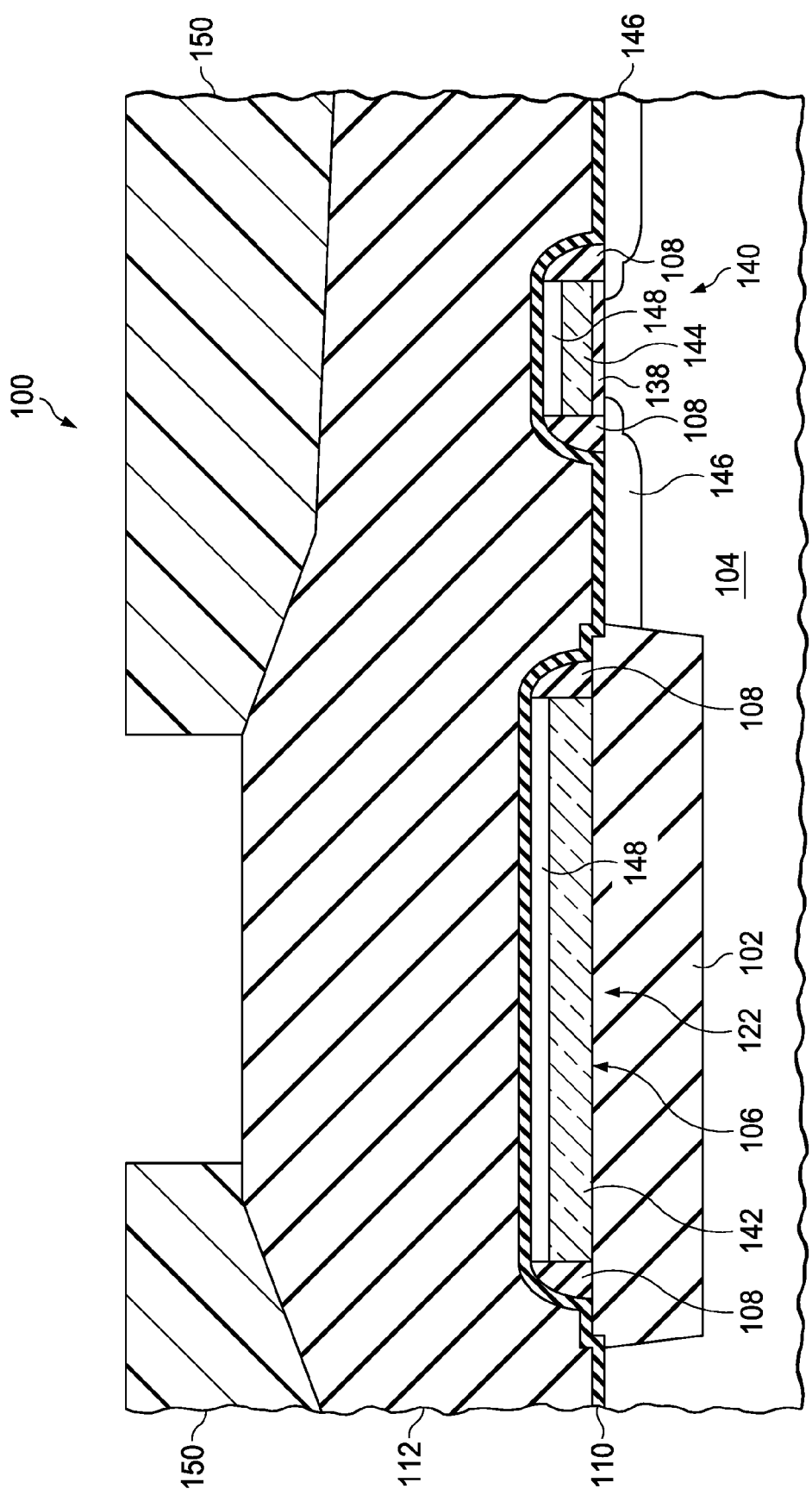

An exemplary method for forming the integrated circuit of FIG. 1 is illustrated in FIG. 2A through FIG. 2D. Referring to FIG. 2A, the integrated circuit 100 is formed in and on the substrate 104, which may be, for example, a silicon wafer, a gallium arsenide wafer or other allow compound semiconductor wafer, a silicon-on-insulator (SOI) wafer, or other substrate appropriate for formation of the integrated circuit 100. The field oxide 102 is formed at a top surface of the substrate 104, for example by a local oxidation of silicon (LOCOS) process or a shallow trench isolation (STI) process.

A gate dielectric layer 138 of a metal oxide semiconductor (MOS) transistor 140 is formed at the top surface of the substrate 104. A polysilicon sublayer 142 of a bottom plate 106 of the high precision capacitor 122 is formed over the field oxide 102 and concurrently with a gate 144 of the MOS transistor 140 is formed over the gate dielectric layer 138. The dielectric sidewalls 108 may be formed on lateral surfaces of the polysilicon sublayer 142 and the gate 144. Source/drain regions 146 of the MOS transistor 140 are formed in the substrate 104 adjacent to the gate 144. Metal silicide 148 may optionally be formed on the polysilicon sublayer 142 and on the gate 144. The bottom plate 106 of the high precision capacitor 122 includes the polysilicon sublayer 142 and the overlying metal silicide 148 if present. In an alternate version of the instant example, the bottom plate 106 and the gate 144 may include metal gate material or fully silicided silicon (FUSI) gate material.

The optional PMD liner 110 may be formed over an existing top surface of the integrated circuit 100. The PMD liner 110 may be formed, example, by a low pressure chemical vapor deposition (LPCVD) process which forms a silicon nitride layer 10 nanometers to 100 nanometers thick. The PMD layer 112 is formed on the PMD liner 110, for example by a plasma enhanced chemical vapor deposition which forms a layer of BPSG 100 nanometers to 2000 nanometers thick. In one version of the instant example, the PMD layer may be left in an as-formed state before forming a capacitor opening, as depicted in FIG. 2A. In an alternate version, the PMD layer 112 may possibly be planarized before forming the capacitor opening.

A capacitor opening mask 150 is formed over the PMD layer 112 so as to expose an area over the bottom plate 106 for a subsequently formed capacitor opening. The capacitor opening mask 150 may include photoresist formed by a photolithographic process or may include hard mask materials such as silicon nitride, silicon carbide or amorphous carbon.

Figure 2B:
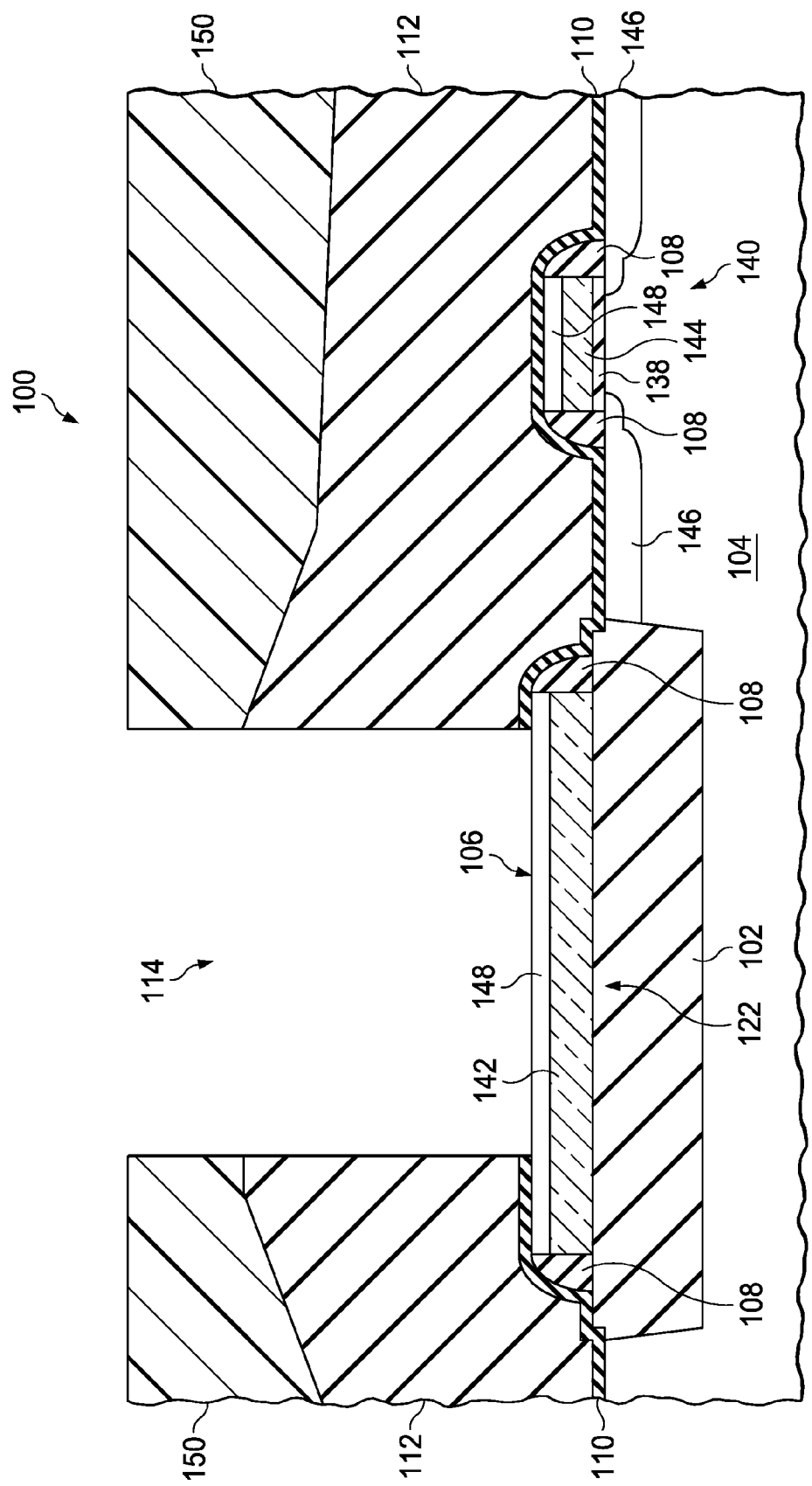

As shown in FIG. 2B, material is removed from the PMD layer 112 and from the PMD liner 110 if present in an area exposed by the capacitor opening mask 150 to form the capacitor opening 114 which exposes the bottom plate 106. The material may be removed from the PMD layer 112, for example, by a reactive ion etch (RIE) process using fluorine radicals. The bottom plate 106 extends past the capacitor opening 114 on all sides so that the capacitor opening 114 is surrounded by the bottom plate 106. In one version of the instant example, the PMD liner 110 in the capacitor opening 114 may be removed while the capacitor opening mask 150 is in place, as depicted in FIG. 2B. In another version, the capacitor opening mask 150 may be removed before the PMD liner 110 in the capacitor opening 114 is removed.

Photoresist and any other polymer materials in the capacitor opening mask 150 may be removed by ashing, possibly followed by a wet clean including an aqueous mixture of ammonium hydroxide and hydrogen peroxide. The aqueous mixture of ammonium hydroxide and hydrogen peroxide may advantageously smooth the metal silicide 148 in the capacitor opening 114.

Figure 2C:
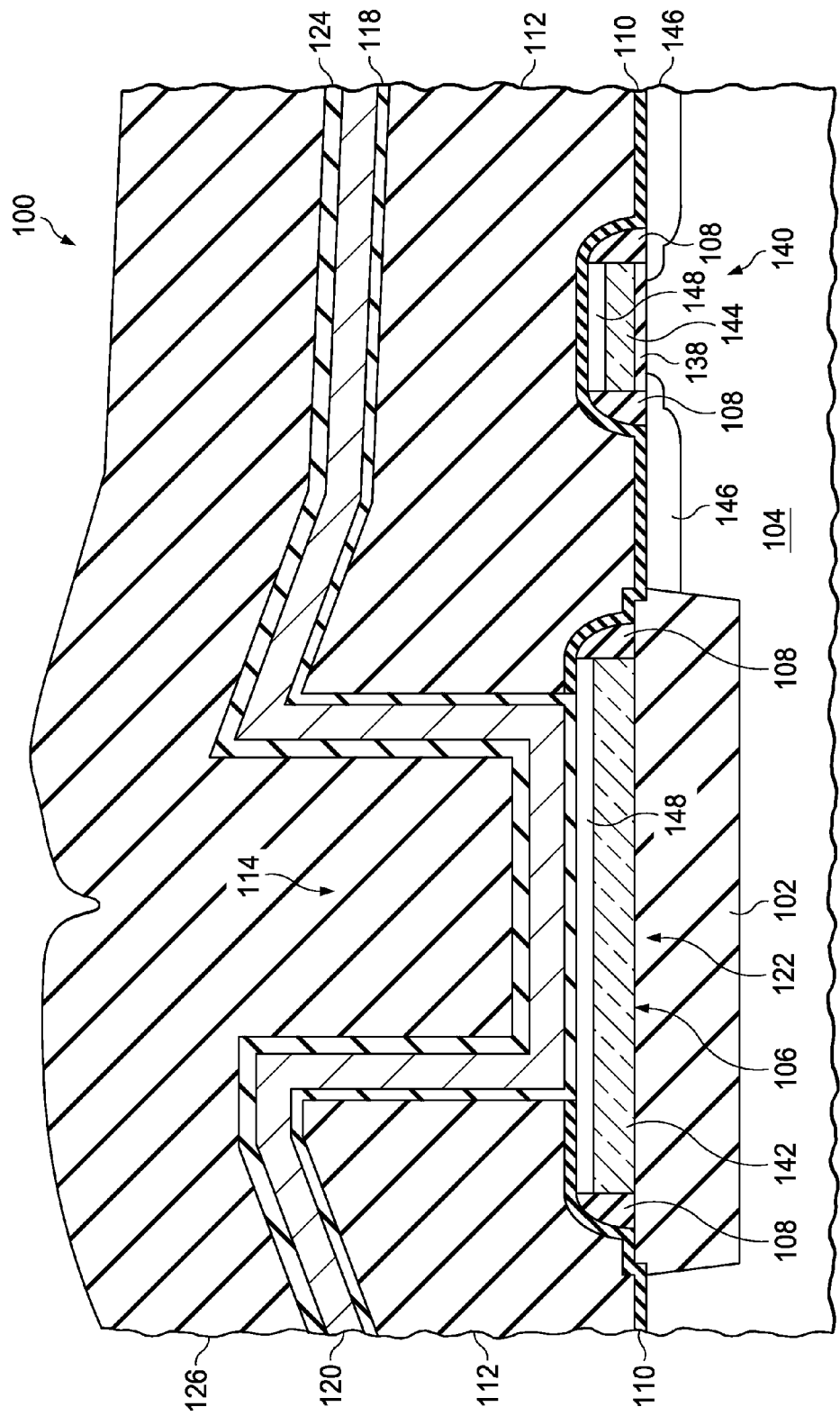

Referring to FIG. 2C, the capacitor dielectric layer 118 is formed on the PMD layer 112, extending contiguously into the capacitor opening 114 and covering the PMD layer 112 on sidewalls of the capacitor opening 114 and covering the bottom plate 106 in the capacitor opening 114. The capacitor dielectric layer 118 may include, for example, one or more layers of silicon dioxide, silicon nitride, silicon oxynitride, tantalum pentoxide, aluminum oxide, zirconium oxide, and/ or hafnium oxide. The capacitor dielectric layer 118 may be formed, for example, by sputtering, plasma enhanced chemical vapor deposition (PECVD), high density plasma (HDP) and/or a sequential layer thin film process such as atomic layer deposition (ALD) or multi-station sequential processing (MSSP). A total thickness of the capacitor dielectric layer 118 may be, for example, 10 nanometers to 60 nanometers.

The top plate 120 is formed on the capacitor dielectric layer 118 extending contiguously into the capacitor opening 114 and covering the capacitor dielectric layer 118 on sidewalls of the capacitor opening 114 and covering the capacitor dielectric layer 118 over the bottom plate 106 in the capacitor opening 114. The top plate 120 may include, for example, one or more layers of titanium, titanium nitride, tantalum, tantalum nitride, titanium tungsten and/or tungsten. The top plate 120 may be formed, for example, by sputtering, metal organic chemical vapor deposition (MOCVD), ALD or other metal thin film formation process.

The optional etch stop layer 124 may be formed on the top plate 120. The optional etch stop layer 124 is contiguous over the bottom plate 106 in the capacitor opening 114, and may possibly be contiguous over the sidewalls of the capacitor opening 114. The etch stop layer 124 may include, for example, silicon nitride and/or silicon carbide, and be formed by PECVD or sequential layer thin film process. The etch stop layer 124 may be, for example, 5 nanometers to 20 nanometers thick.

The capacitor planarization layer 126 is formed over the top plate 120 and the etch stop layer 124 if present. The capacitor planarization layer 126 extends into the capacitor opening 114. The capacitor planarization layer 126 may include, for example, BPSG. The capacitor planarization layer 126 is sufficiently thick to fill the capacitor opening 114.

Figure 2D:
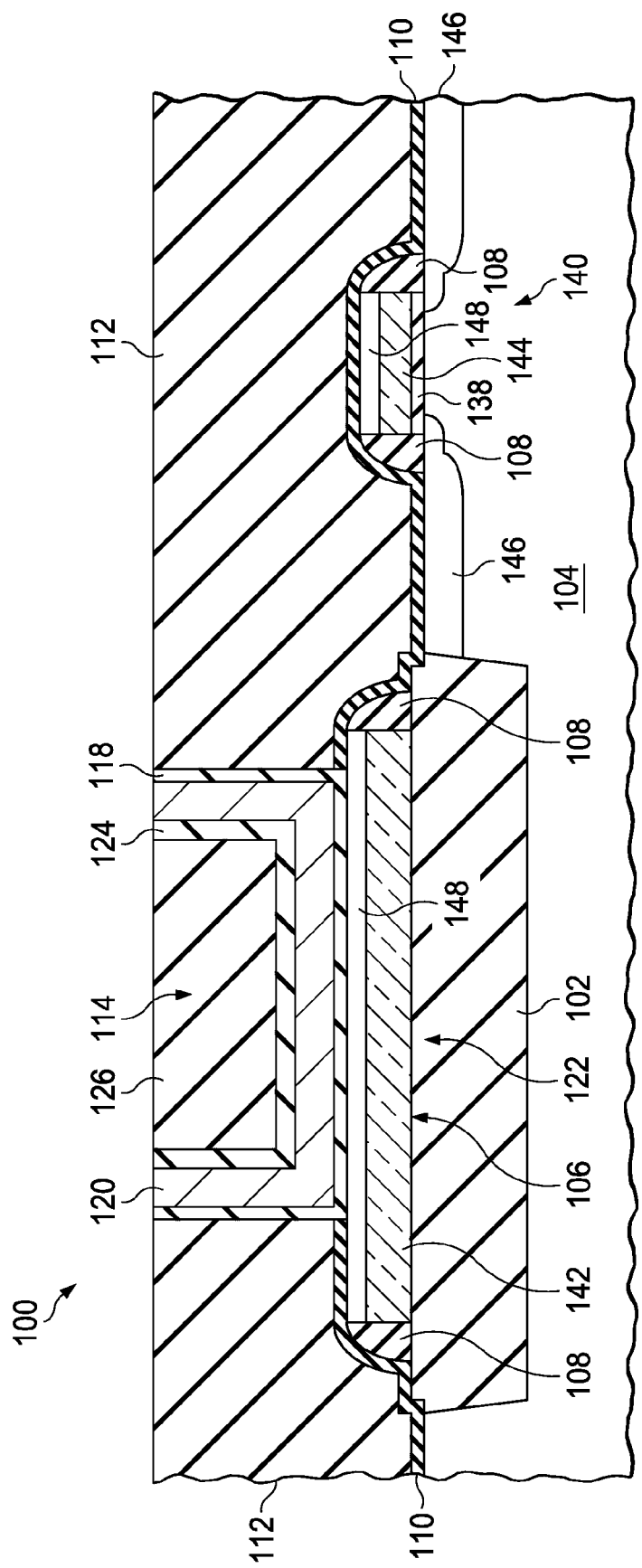

Referring to FIG. 2D, a planarization process, for example a chemical mechanical polish (CMP) process, removes the capacitor planarization layer 126, the etch stop layer 124, the top plate 120, and possibly the capacitor dielectric layer 118 adjacent to the capacitor opening 114, leaving a portion of the capacitor planarization layer 126 in the capacitor opening 114, so that a top surface of the capacitor planarization layer 126 in the capacitor opening 114, and edges of the etch stop layer 124, the top plate 120 and possibly the capacitor dielectric layer 118 in the capacitor opening 114 are substantially coplanar, and furthermore may be coplanar with a top surface of the PMD layer 112, as depicted in FIG. 2D. The top plate 120 does not extend laterally beyond the capacitor opening 114 after the planarization process is completed. The planarization process may optionally include a resist etchback (REB) process which includes forming a planarizing layer of sacrificial material such as organic polymer over the capacitor planarization layer 126 and subsequently etching the sacrificial material, the capacitor planarization layer 126, the etch stop layer 124, the top plate 120, and possibly the capacitor dielectric layer 118 in a plasma etch at substantially the same rates. The top plate 120 does not extend laterally beyond the capacitor opening 114 and is thus electrically isolated after the planarization process is completed. The bottom plate 106, the capacitor dielectric layer 118 and the top plate 120 provide the high precision capacitor 122. Electrical connection is subsequently made to the bottom plate 106 and the top plate 120; several configurations of connections are disclosed herein.

Figure 3:
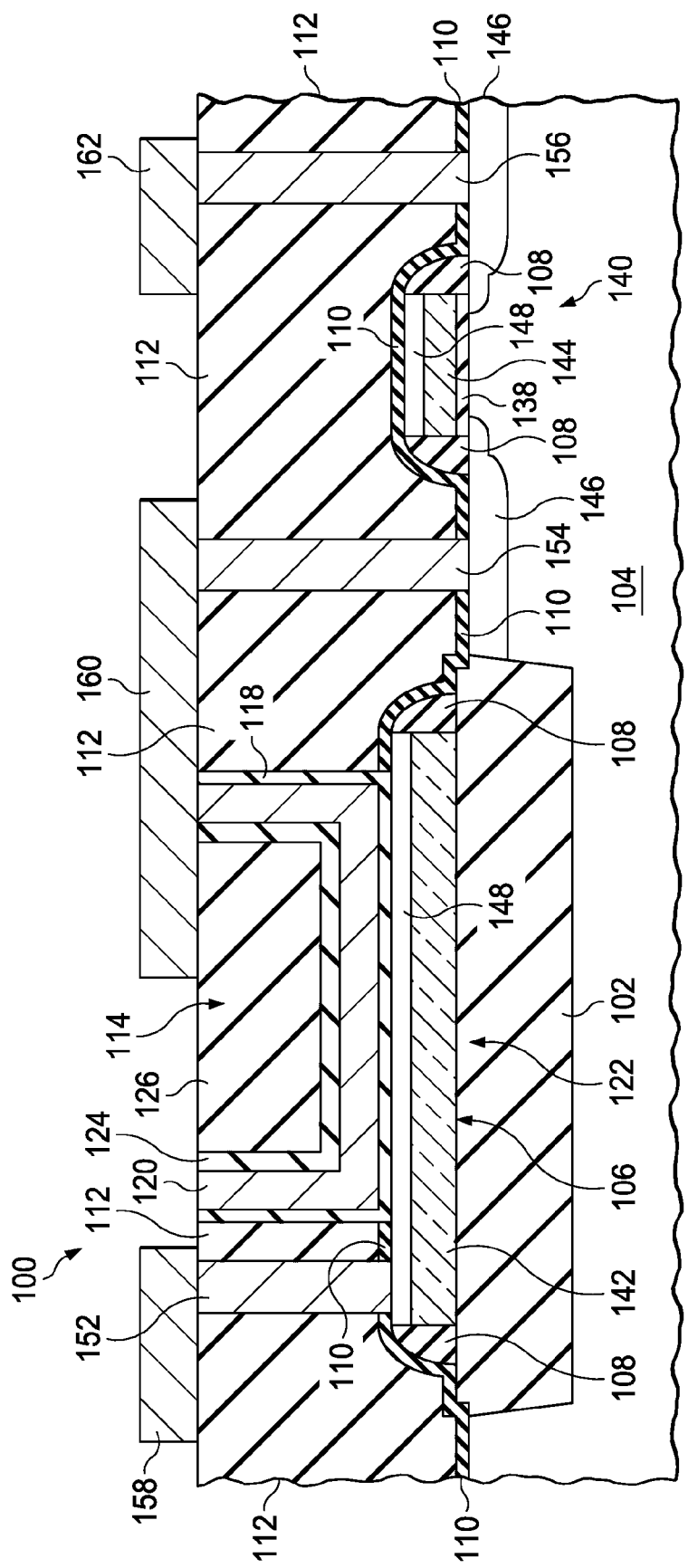

Several options that are illustrated in FIG. 3 through FIG. 6 are available for making connections between a first interconnect layer and the high precision capacitor 122. In FIG. 3, contacts 152, 154, and 156 are formed by forming an etch mask over the PMD layer 112 and etching contact holes through the PMD layer 112 and the PMD liner 110 to the bottom plate 106 and the source/drain regions 146 of the MOS transistor 140. The contact holes are then filled with metal such as a metal liner of titanium and titanium nitride and a fill metal of tungsten, and planarized. A metal layer stack including an adhesion layer of titanium, titanium tungsten and/or titanium nitride, and a layer of 100 nanometers to 2000 nanometers of aluminum possibly with a few percent copper, silicon and/or titanium, may then be formed on an existing top surface of the integrated circuit 100 and etched to form a first interconnect 158 connected to the bottom plate 106, a second interconnect 160 connected to an edge of the top plate 120 and one of the source/drain regions 146, and third interconnect 162 connected to another of the source/drain regions 146. Alternatively, an electrical connection to the bottom plate 106 may be made through a local interconnect of gate material formed concurrently with the bottom plate 106 and the gate 144 of the MOS transistor 140. Other methods of forming the electrical connection to the bottom plate 106 are within the scope of the instant example.

Figure 4:
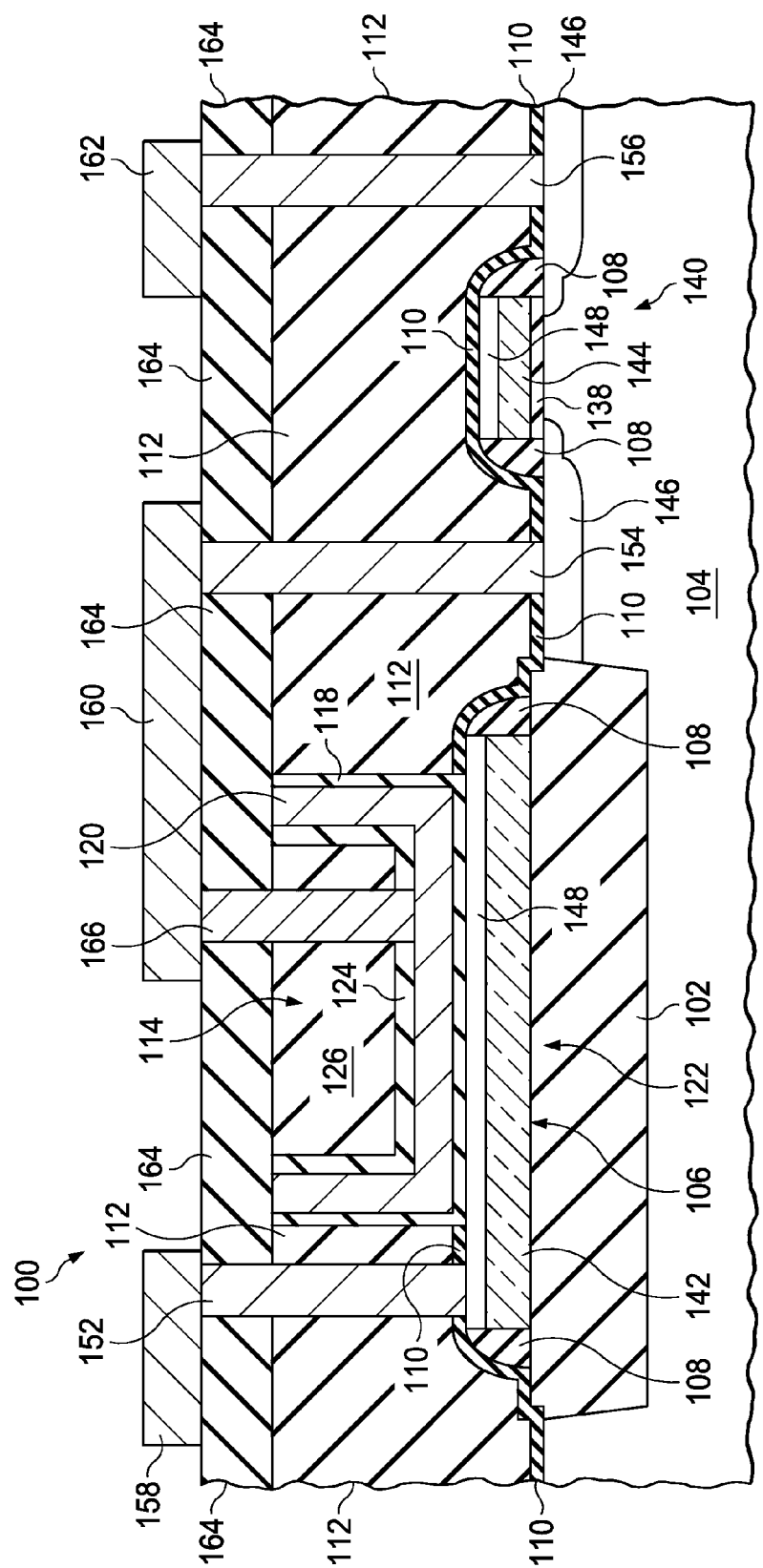

Alternatively, as shown in FIG. 4, a PMD cap layer 164 may be formed on an existing top surface of the integrated circuit 100 after the high precision capacitor 122 is formed and prior to forming the contacts 152, 154 and 156. The PMD cap layer 164 may include, for example, 5 nanometers to 25 nanometers of silicon nitride and/or silicon carbide, formed by a PECVD process. The contacts 152, 154 and 156 are formed through the PMD cap layer 164, the PMD layer 112 and the PMD liner 110, as described in reference to FIG. 3. Contact 166 is formed through the PMD cap layer 164, the capacitor planarization layer 126 and the etch stop layer 124 to make electrical connection to the top plate 120. The contact 166 may be formed concurrently with the contacts 152, 154 and 156. The interconnects 158, 160 and 162 are subsequently formed as described in reference to FIG. 3. In the instant example, the second interconnect 160 makes connection to the contact 154 and the contact 166 which make connections to one of the source/drain regions 146 and to the top plate 120, respectively. Forming the PMD cap layer 164 may be advantageous if interconnects are routed over the high precision capacitor 122.

Figure 5:
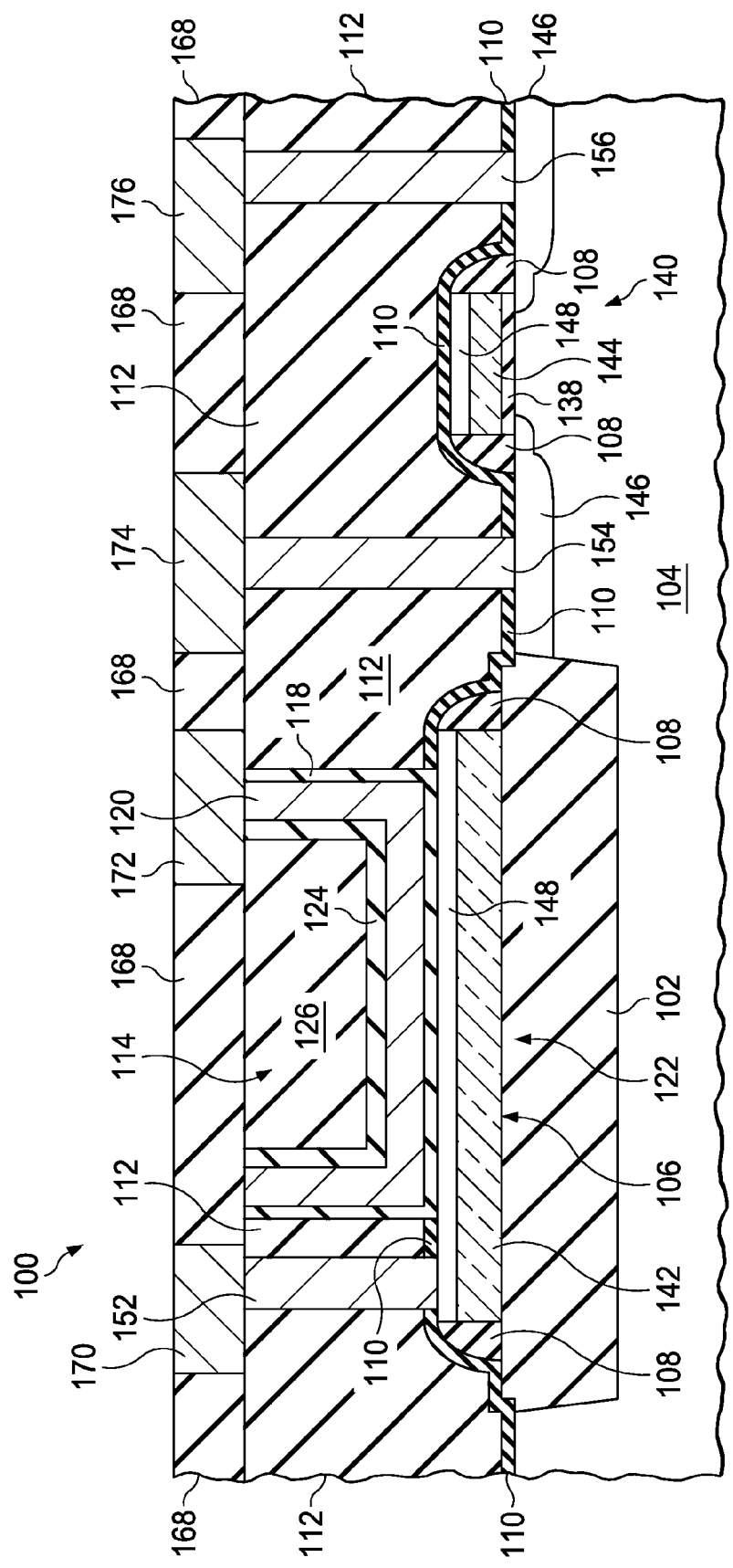

In FIG. 5, contacts 152, 154, and 156 are formed through the PMD layer 112 and the PMD liner 110 to make connections to the bottom plate 106 and the source/drain regions 146 of the MOS transistor 140, as described in reference to FIG. 3 An intra-metal dielectric (IMD) layer 168 is formed over the PMD layer 112 and the contacts 152, 154, and 156. The IMD layer 168 may include, for example, 100 nanometers to 2000 nanometers of silicon dioxide formed by a PECVD process using tetraethyl orthosilicate, also known as tetraethoxysilane or TEOS. Damascene interconnects 170, 172, 174 and 176 are formed through the ILD layer 168 to make connections to the contact 152, the edge of the top plate 120, the contact 154 and the contact 156, respectively. The damascene interconnects 170, 172, 174 and 176 may be formed, for example, by forming trenches through the ILD layer 168 exposing the 152, 154, and 156 and the edge of the top plate 120. A metal liner of tantalum nitride is formed over the ILD layer 168 extending into the trenches using an ALD process, and a seed layer of copper is formed on the metal liner using a sputter process. A fill layer of copper is formed on the seed layer using an electroplating process so as to fill the trenches. The fill layer, the seed layer and the metal liner are removed from a top surface of the ILD layer 168 using a CMP process, leaving the damascene interconnects 170, 172, 174 and 176.

Figure 6:
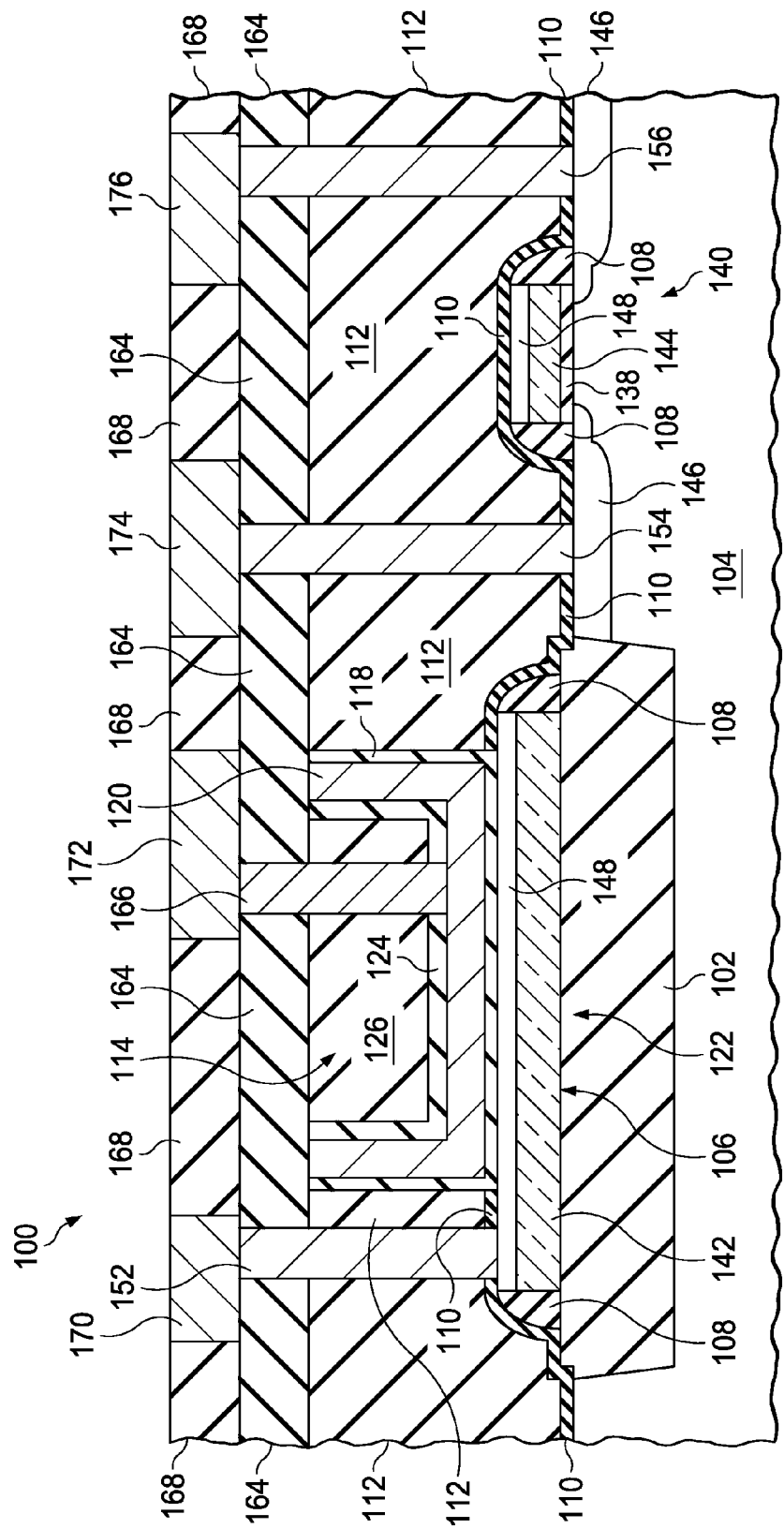

Alternatively, as shown in FIG. 6, the PMD cap layer 164 may be formed on the existing top surface of the integrated circuit 100 after the high precision capacitor 122 is formed and prior to forming the contacts 152, 154 and 156, as described in reference to FIG. 4. The contacts 152, 154 and 156 are formed through the PMD cap layer 164, the PMD layer 112 and the PMD liner 110, and contact 166 is formed through the PMD cap layer 164, the capacitor planarization layer 126 and the etch stop layer 124 to make electrical connection to the top plate 120, as described in reference to FIG. 4. The IMD layer 168 is formed over the PMD layer 112 and the contacts 152, 154, 156 and 166, as described in reference to FIG. 5. Damascene interconnects 170, 172, 174 and 176 are formed through the ILD layer 168 to make connections to the contact 152, the contact 166, the contact 154 and the contact 156, respectively, as described in reference to FIG. 5. Forming the PMD cap layer 164 may be advantageous if damascene interconnects are routed over the high precision capacitor 122. After formation of the interconnects depicted in FIG. 3 through FIG. 6, additional layers of dielectric and interconnect may be added to complete the integrated circuit 100.

Figure 7A:
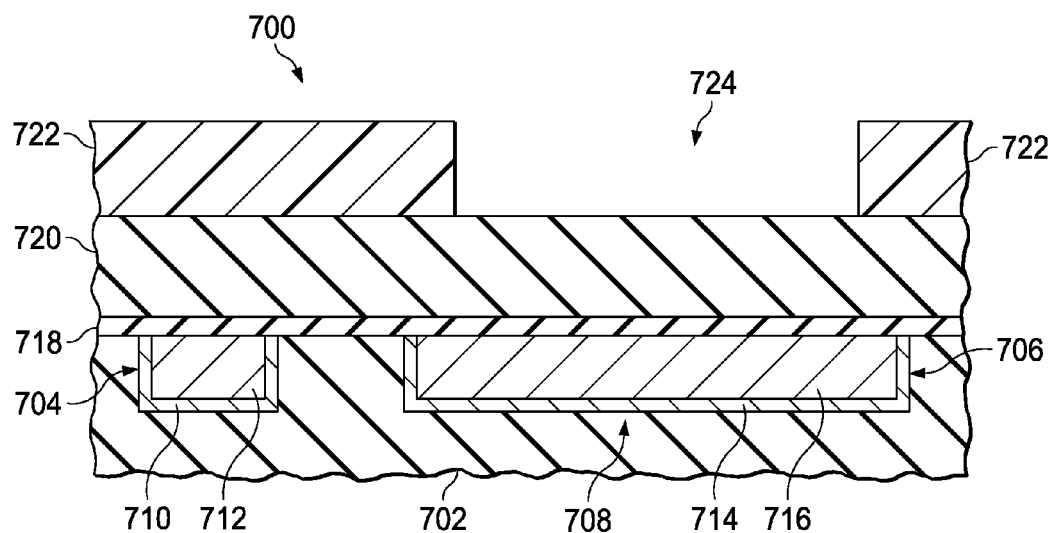

FIG. 7A through FIG. 7F show another integrated circuit containing an exemplary high precision capacitor, depicted in successive stages of fabrication. Referring to FIG. 7A, the integrated circuit 700 includes a lower dielectric layer 702 which may possibly be a lower ILD layer 702 or a lower IMD layer 702, as part of a system of dielectric layers and metal interconnects. A metal interconnect 704 and a bottom plate 706 of the high precision capacitor 708 are formed concurrently in the lower dielectric layer 702. The metal interconnect 704 may include a metal liner 710 and a fill metal 712; similarly, the bottom plate 706 may include a metal liner 714 and a fill metal 716, formed by a damascene process. The metal liners 710 and 714 may include tantalum nitride formed by an ALD process and a seed layer of copper formed by a sputtering process. The fill metals 712 and 716 may be predominantly copper formed by an electroplating process. The bottom plate 706 is thus an element of a level of metal interconnects of the integrated circuit 700.

An optional etch stop layer 718 may be formed over the lower dielectric layer 702, the metal interconnect 704 and the bottom plate 706. The etch stop layer 718 may include, for example, 5 nanometers to 25 nanometers of silicon nitride and/or silicon carbide formed by a PECVD process. An upper ILD layer 720 is formed over the etch stop layer 718. The upper ILD layer 720 may include, for example, silicon dioxide based dielectric material formed by a PECVD process using TEOS, or a sub-atmospheric chemical vapor deposition (SACVD) process using silane and oxygen, or may include low-k dielectric material such as organo-silicate glass (OSG), carbon-doped silicon oxides (SiCO or CDO) or dielectric material formed using methylsilsesquioxane (MSQ). The upper ILD layer 720 may be, for example, 200 nanometers to 3000 nanometers thick. The upper ILD layer 720 may include a cap layer, not shown, including silicon nitride or silicon carbide.

A capacitor opening mask 722 is formed over the upper ILD layer 720 so as to expose an area over the bottom plate 706 for a subsequently formed capacitor opening. The capacitor opening mask 722 may include photoresist formed by a photolithographic process or may include hard mask materials such as silicon nitride, silicon carbide or amorphous carbon.

Figure 7B:
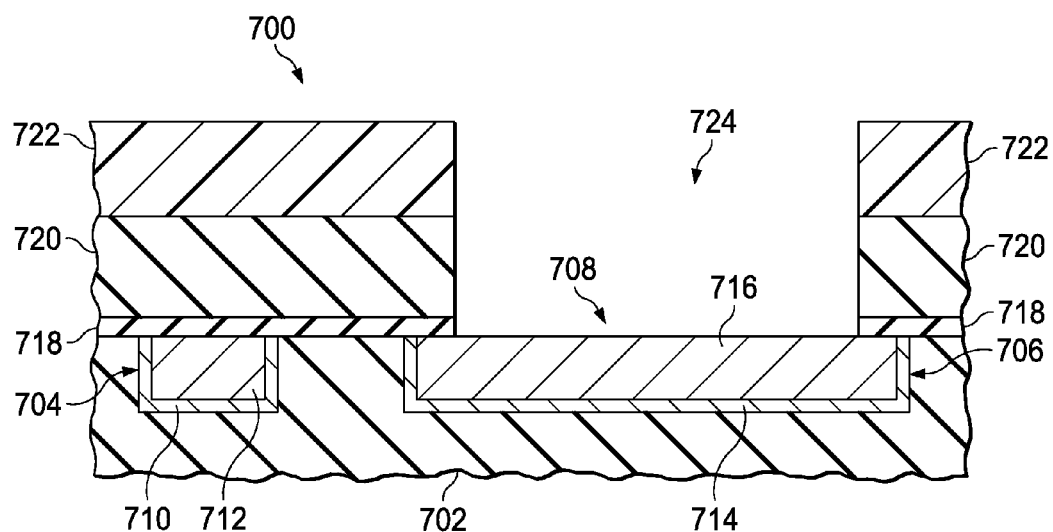

Referring to FIG. 7B, material is removed from the upper ILD layer 720 and from the etch stop layer 718 if present in an area exposed by the capacitor opening mask 722 to form the capacitor opening 724 which exposes the bottom plate 706. The material may be removed from the upper ILD layer 720, for example, by an RIE process. The bottom plate 706 extends past the capacitor opening 724 on all sides so that the capacitor opening 724 is surrounded by the bottom plate 706. In one version of the instant example, the etch stop layer 718 in the capacitor opening 724 may be removed while the capacitor opening mask 722 is in place, as depicted in FIG. 7B. In another version, the capacitor opening mask 722 may be removed before the etch stop layer 718 in the capacitor opening 724 is removed. Photoresist and any other polymer materials in the capacitor opening mask 722 may be removed by ashing, possibly followed by a wet clean.

Figure 7C:
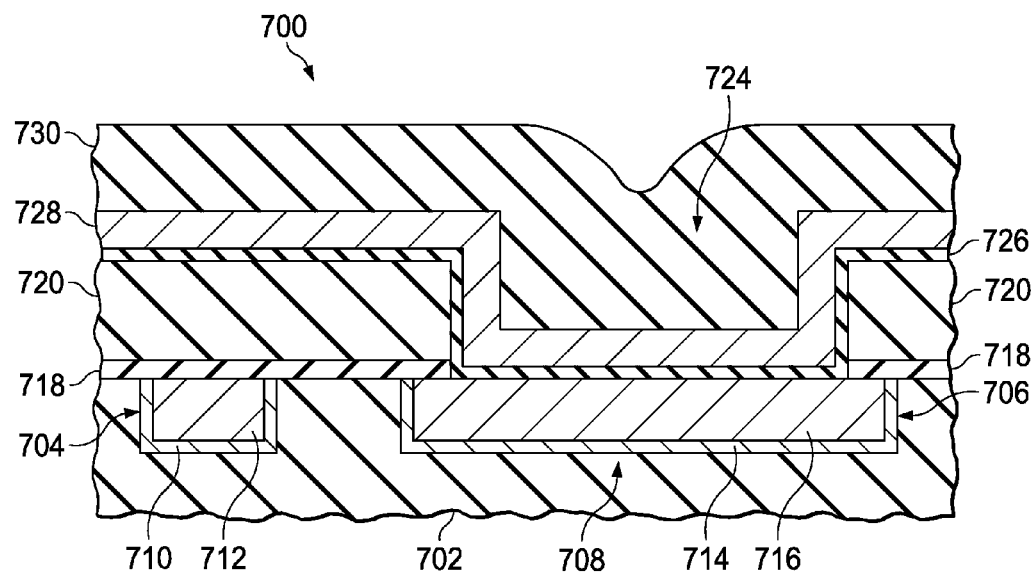

Referring to FIG. 7C, a capacitor dielectric layer 726 is formed on the upper ILD layer 720, extending contiguously into the capacitor opening 724 and covering the upper ILD layer 720 on sidewalls of the capacitor opening 724 and covering the bottom plate 706 in the capacitor opening 724. The capacitor dielectric layer 726 may be formed as described in reference to FIG. 2C. A total thickness of the capacitor dielectric layer 726 may be, for example, 10 nanometers to 60 nanometers.

A top plate 728 is formed on the capacitor dielectric layer 726 extending contiguously into the capacitor opening 724 and covering the capacitor dielectric layer 726 on sidewalls of the capacitor opening 724 and covering the capacitor dielectric layer 726 over the bottom plate 706 in the capacitor opening 724. The top plate 728 may include, for example, one or more layers of titanium, titanium nitride, tantalum, tantalum nitride, titanium tungsten, aluminum and/or copper. The top plate 728 may be formed, for example, by sputtering, MOCVD, ALD or other metal thin film formation process. An optional etch stop layer, not shown, may be formed on the top plate 728, for example as described in reference to FIG. 2C.

A capacitor planarization layer 730 is formed over the top plate 728, extending into the capacitor opening 724. The capacitor planarization layer 730 may include, for example, silicon dioxide based dielectric material formed by PECVD, HDP or SACVD. A thickness of the capacitor planarization layer 730 is sufficient to fill the capacitor opening 724.

Figure 7D:
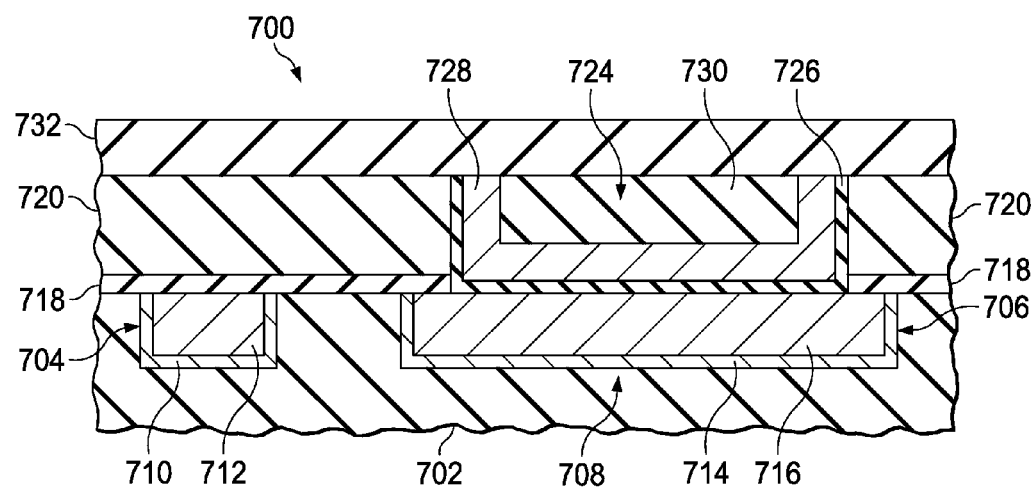

Referring to FIG. 7D, a planarization process, for example a CMP process, removes the capacitor planarization layer 730, the top plate 728, and possibly the capacitor dielectric layer 726 adjacent to the capacitor opening 724, leaving a portion of the capacitor planarization layer 730 in the capacitor opening 724, so that a top surface of the capacitor planarization layer 730 in the capacitor opening 724, and edges of the top plate 728 and possibly the capacitor dielectric layer 726 in the capacitor opening 724 are substantially coplanar, and furthermore may be coplanar with a top surface of the upper ILD layer 720, as depicted in FIG. 7D. The top plate 728 does not extend laterally beyond the capacitor opening 724. The planarization process may optionally include an REB process as described in reference to FIG. 2D. The top plate 728 is electrically isolated after the planarization process is completed, so that the bottom plate 706, the capacitor dielectric layer 726 and the top plate 728 provide the high precision capacitor 708.

An upper IMD layer 732 is formed over the upper ILD layer 720 and the high precision capacitor 708. The upper IMD layer 732 may include similar dielectric materials as the upper ILD layer 720 and may be formed using similar processes. A thickness of the upper IMD layer 732 may be, for example, 100 nanometers to 2000 nanometers thick. The upper IMD layer 732 may include an etch stop layer and/or a cap layer, not shown.

Figure 7E:
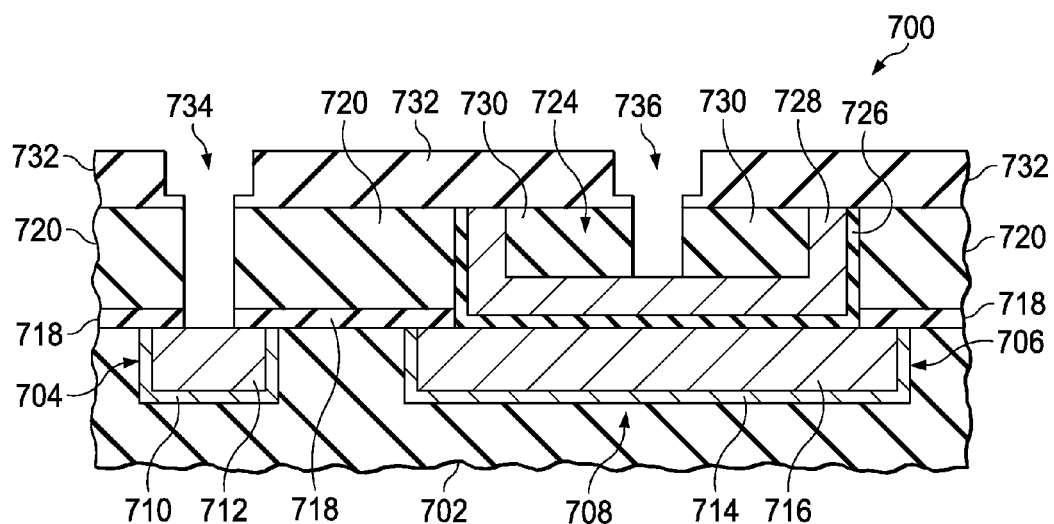

Referring to FIG. 7E, a first dual damascene trench/via hole 734 is formed through the upper IMD layer 732 and the upper ILD layer 720 and the etch stop layer 718 if present to expose the metal interconnect 704. A second dual damascene trench/via hole 736 is formed through the upper IMD layer 732 and the capacitor planarization layer 730 to expose the top plate 728. The first dual damascene trench/via hole 734 and the second dual damascene trench/via hole 736 may be formed concurrently, for example using a trench first process, a via first process or a partial via first process.

Figure 7F:
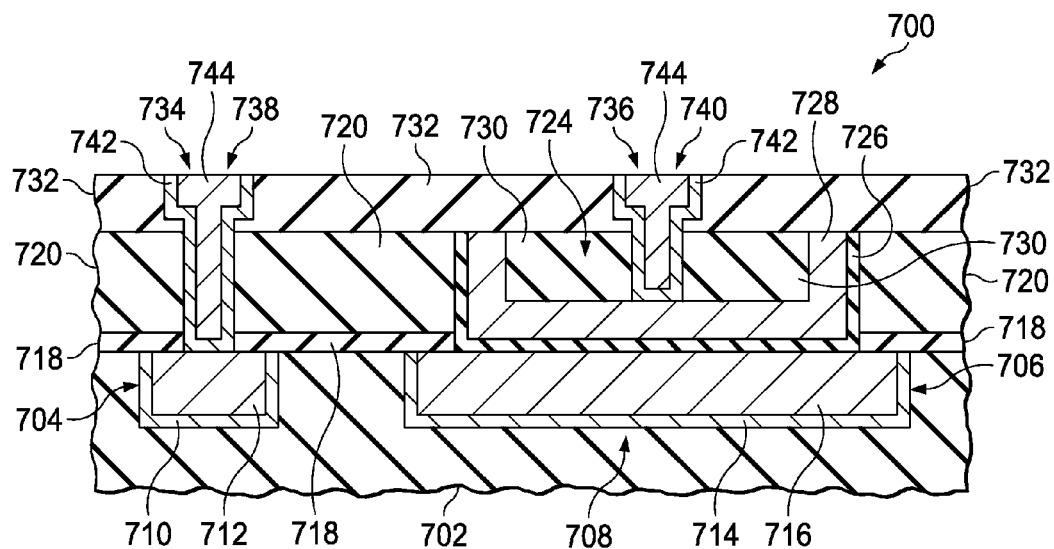

Referring to FIG. 7F, a first dual damascene interconnect/via 738 and a second dual damascene interconnect/via 740 are formed concurrently in the first dual damascene trench/via hole 734 and the second dual damascene trench/via hole 736, respectively. The first dual damascene interconnect/via 738 makes an electrical connection to the metal interconnect 704. The second dual damascene interconnect/via 740 makes an electrical connection to the top plate 728. The first dual damascene interconnect/via 738 and the second dual damascene interconnect/via 740 may include a metal liner 742 and a fill metal 744 as described in reference to FIG. 7A.

An electrical connection to the bottom plate 706 may be made through an interconnect in the same interconnect level as the bottom plate 706 and the metal interconnect 704. Alternatively, the electrical connection to the bottom plate 706 may be made through a dual damascene interconnect/via formed concurrently with the first dual damascene interconnect/via 738 and the second dual damascene interconnect/via 740. Other methods of forming the electrical connection to the bottom plate 706 are within the scope of the instant example.

Figure 8A:
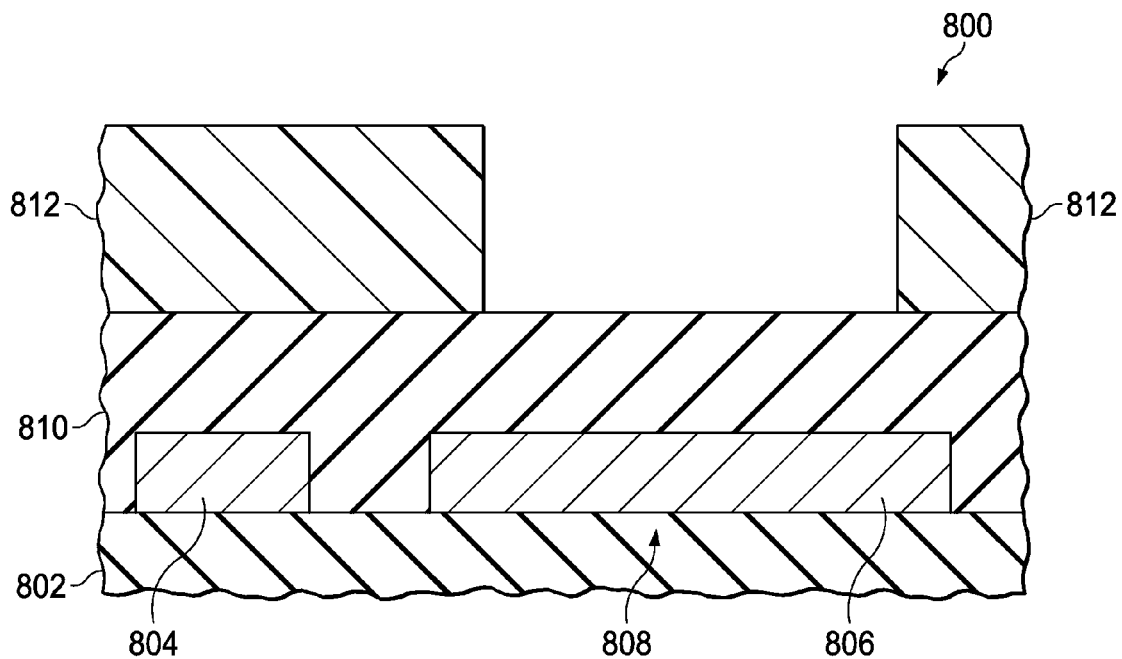

FIG. 8A through FIG. 8F show a further integrated circuit containing an exemplary high precision capacitor, depicted in successive stages of fabrication. Referring to FIG. 8A, the integrated circuit 800 includes a lower dielectric layer 802 which may possibly be a lower ILD layer 802 or a lower IMD layer 802, as part of a system of dielectric layers and metal interconnects. A metal interconnect 804 and a bottom plate 806 of the high precision capacitor 808 are formed concurrently over the lower dielectric layer 802. The metal interconnect 804 and the bottom plate 806 may include, for example, a metal layer stack including an adhesion layer of titanium, titanium tungsten and/or titanium nitride, 2 nanometers to 20 nanometers thick, a layer of 100 nanometers to 2000 nanometers of predominantly aluminum possibly with a few percent copper, silicon and/or titanium on the adhesion layer, and an anti-reflection layer of titanium nitride 10 nanometers to 20 nanometers thick on the aluminum layer. The metal interconnect 804 and the bottom plate 806 may be formed, for example, by forming a layer stack of interconnect metal on the lower dielectric layer 802 and forming an etch mask over the layer stack of interconnect metal which covers areas for the metal interconnect 804 and the bottom plate 806. Metal is removed from the layer stack of interconnect metal exposed by the etch mask so as to leave the metal interconnect 804 and the bottom plate 806. The bottom plate 806 is thus an element of a level of metal interconnects of the integrated circuit 800.

A first upper ILD layer 810 is formed over an existing top surface of the integrated circuit 800. The first upper ILD layer 810 may include similar materials and be formed with similar processes as described in reference to FIG. 7A. A top surface of the first upper ILD layer 810 may possibly be planarized, for example by a CMP operation, as depicted in FIG. 8A.

A capacitor opening mask 812 is formed over the first upper ILD layer 810 so as to expose an area over the bottom plate 806 for a subsequently formed capacitor opening. The capacitor opening mask 812 may include photoresist formed by a photolithographic process or may include hard mask materials such as silicon nitride, silicon carbide or amorphous carbon.

Figure 8B:
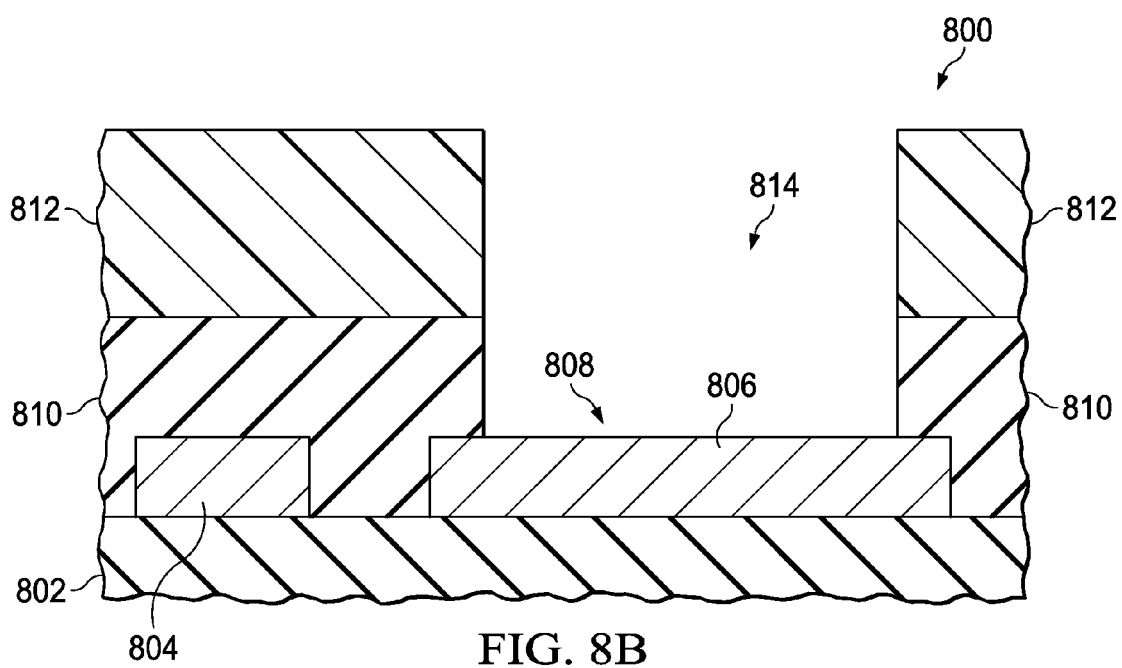

Referring to FIG. 8B, material is removed from the first upper ILD layer 810 in an area exposed by the capacitor opening mask 812 to form the capacitor opening 814 which exposes the bottom plate 806. The material may be removed from the upper ILD layer 810, for example, by an RIE process. The bottom plate 806 extends past the capacitor opening 814 on all sides so that the capacitor opening 814 is surrounded by the bottom plate 806. The capacitor opening mask 812 is subsequently removed. Photoresist and any other polymer materials in the capacitor opening mask 812 may be removed by ashing, possibly followed by a wet clean.

Figure 8C:
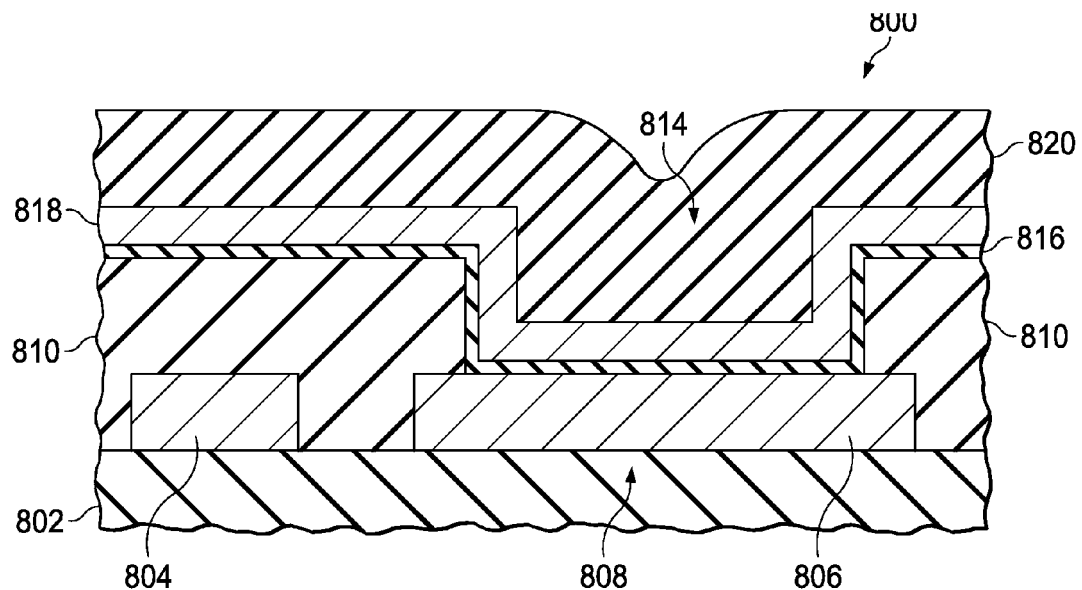

Referring to FIG. 8C, a capacitor dielectric layer 816 is formed on the first upper ILD layer 810, extending contiguously into the capacitor opening 814 and covering the first upper ILD layer 810 on sidewalls of the capacitor opening 814 and covering the bottom plate 806 in the capacitor opening 814. The capacitor dielectric layer 816 may be formed as described in reference to FIG. 2C. A total thickness of the capacitor dielectric layer 816 may be, for example, 10 nanometers to 60 nanometers.

A top plate 818 is formed on the capacitor dielectric layer 816 extending contiguously into the capacitor opening 814 and covering the capacitor dielectric layer 816 on sidewalls of the capacitor opening 814 and covering the capacitor dielectric layer 816 over the bottom plate 806 in the capacitor opening 814. The top plate 818 may include, for example, one or more layers of titanium, titanium nitride, tantalum, tantalum nitride, titanium tungsten, aluminum and/or copper. The top plate 818 may be formed, for example, by sputtering, MOCVD, ALD or other metal thin film formation process. An optional etch stop layer, not shown, may be formed on the top plate 818, for example as described in reference to FIG. 2C.

A capacitor planarization layer 820 is formed over the top plate 818, extending into the capacitor opening 814. The capacitor planarization layer 820 may include, for example, silicon dioxide based dielectric material formed by PECVD, HDP or SACVD. A thickness of the capacitor planarization layer 820 is sufficient to fill the capacitor opening 814.

Figure 8D:
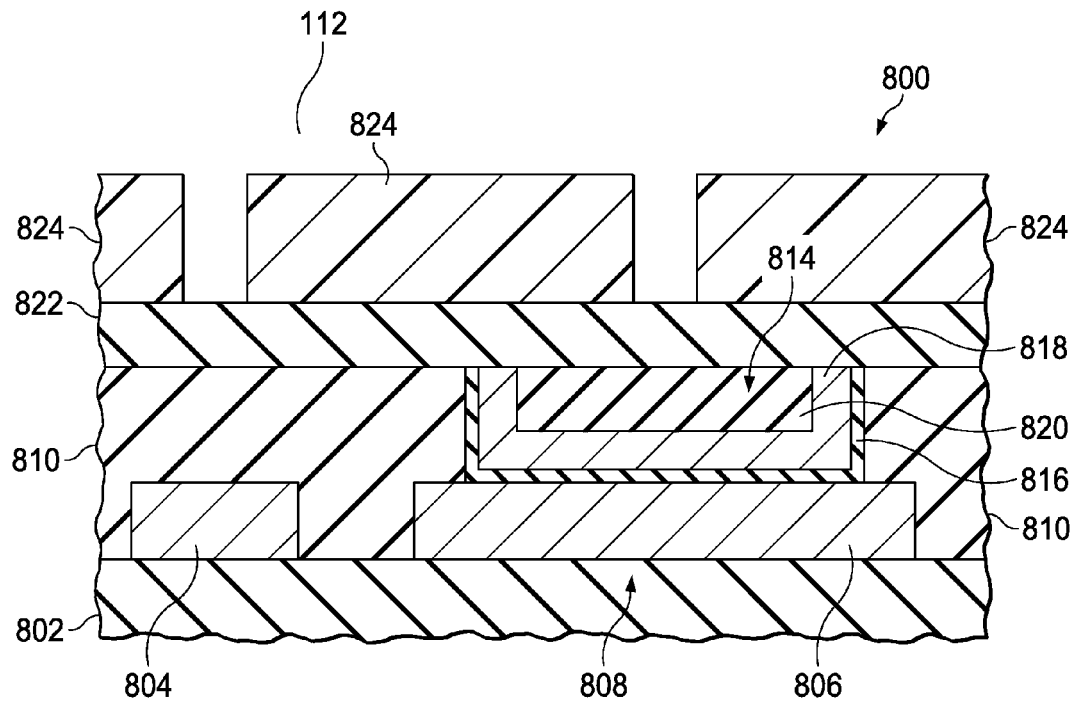

Referring to FIG. 8D, a planarization process, for example a CMP process, removes the capacitor planarization layer 820, the top plate 818, and possibly the capacitor dielectric layer 816 adjacent to the capacitor opening 814, leaving a portion of the capacitor planarization layer 820 in the capacitor opening 814, so that a top surface of the capacitor planarization layer 820 in the capacitor opening 814, and edges of the top plate 818 and possibly the capacitor dielectric layer 816 in the capacitor opening 814 are substantially coplanar, and furthermore may be coplanar with a top surface of the first upper ILD layer 810, as depicted in FIG. 8D. The top plate 818 does not extend laterally beyond the capacitor opening 814. The planarization process may optionally include an REB process as described in reference to FIG. 2D. The top plate 818 is electrically isolated after the planarization process is completed, so that the bottom plate 806, the capacitor dielectric layer 816 and the top plate 818 provide the high precision capacitor 808.

A second upper ILD layer 822 is formed over the first upper ILD layer 810 and the high precision capacitor 808. The second upper ILD layer 822 may include similar dielectric materials as the first upper ILD layer 810 and may be formed using similar processes. A thickness of the second upper ILD layer 822 may be, for example, 30 nanometers to 300 nanometers thick. The second upper ILD layer 822 may include a cap layer, not shown.

A via mask 824 is formed over the second upper ILD layer 822 so as to expose areas for subsequently formed vias over the metal interconnect 804 and the bottom plate 806. The via mask 824 may include photoresist formed by a photolithographic process or may include hard mask material such as silicon nitride, silicon carbide or amorphous carbon.

Figure 8E:
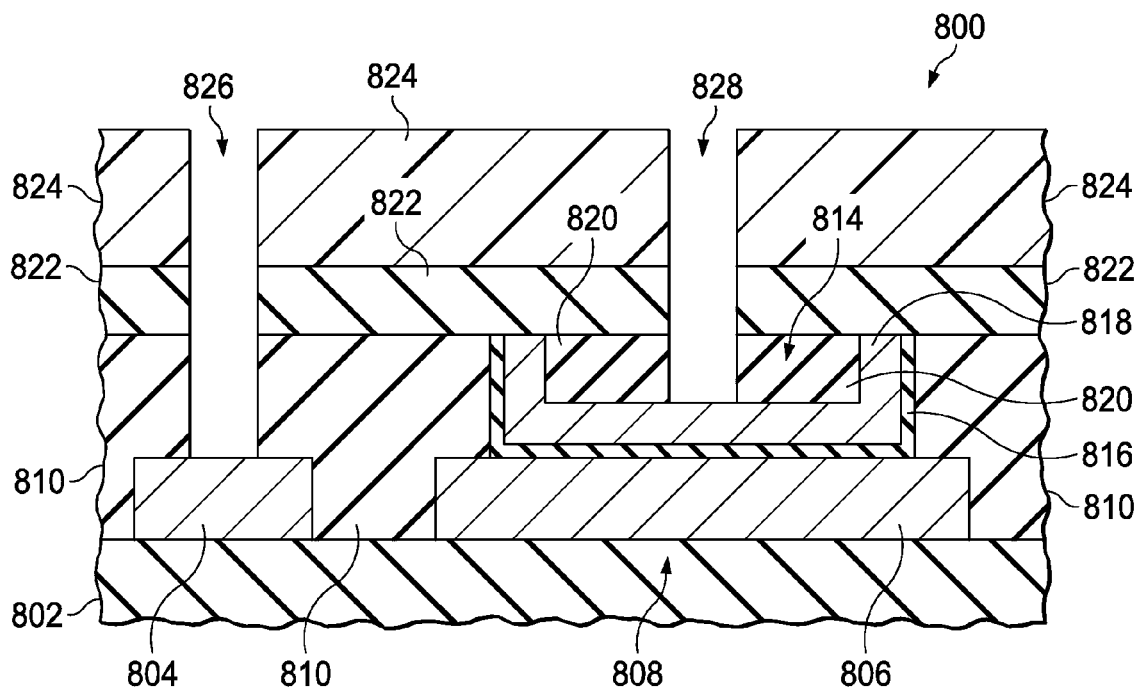
Figure 8F:
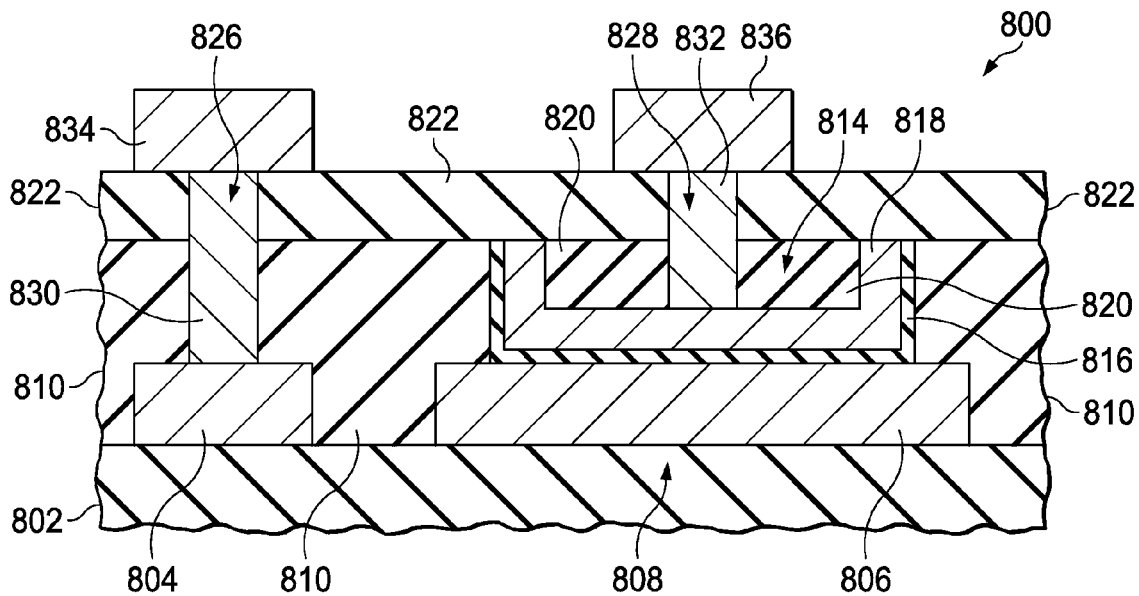

Referring to FIG. 8E, a first via hole 826 is formed through the second upper ILD layer 822 and the first upper ILD layer 810 in one of the areas exposed by the via mask 824 so as to expose the metal interconnect 804. Concurrently, a second via hole 828 is formed through the second upper ILD layer 822 and the capacitor planarization layer 820 in another of the areas exposed by the via mask 824 so as to expose the top plate 818. The first via hole 826 and the second via hole 828 may be formed using an RIE process. The via mask 824 is subsequently removed, for example as discussed in reference to FIG. 2B Referring to FIG. 8F, a first via 830 is formed in the first via hole 826 and a second via 832 is concurrently formed in the second via hole 828. The first via 830 makes an electrical connection to the metal interconnect 804 and the second via 832 makes an electrical connection to the top plate 818. The vias 830 and 832 may be formed, for example, by forming a metal liner of titanium by a sputtering process and a layer of titanium nitride by a reactive sputtering process or an ALD process in the via holes 826 and 828, and forming a fill metal of tungsten using an MOCVD process on the metal liner to fill the via holes 826 and 828. The fill metal and the metal liner are subsequently removed from a top surface of the second upper ILD layer 822 by a CMP process and/or an etchback process.

A first interconnect 834 is formed over the second upper ILD layer 822 contacting the first via 830, and a second interconnect 836 is concurrently formed over the second upper ILD layer 822 contacting the second via 832. The first interconnect 834 and the second interconnect 836 may be formed of similar materials and by similar processes as the metal interconnect 804 and the bottom plate 806.

An electrical connection to the bottom plate 806 may be made through an interconnect in the same interconnect level as the bottom plate 806 and the metal interconnect 804. Alternatively, the electrical connection to the bottom plate 806 may be made through a via and interconnect formed concurrently with the first via 830 and the first interconnect 834. Other methods of forming the electrical connection to the bottom plate 806 are within the scope of the instant example.

The high precision capacitors described in the examples may be formed with tight control over effective capacitor areas. In these examples, only one additional photolithography is needed to add the high precision capacitor to an integrated circuit process flow. In addition, problems with dimensional control and with capacitor degradation due to etch residue or damage to a capacitor dielectric that may be caused during plasma or wet etching of a capacitor top plate in a conventional planar capacitor may be avoided.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a first dielectric layer;
a bottom plate of a high precision capacitor disposed over said dielectric layer;
a second dielectric layer disposed over said bottom plate and said first dielectric layer, said second dielectric layer having a capacitor opening over said bottom plate, so that said bottom plate extends past said capacitor opening on all sides;
a capacitor dielectric layer of said high precision capacitor disposed on said bottom plate in said capacitor opening and disposed on said second dielectric layer on sidewalls of said capacitor opening, extending to a top of said capacitor opening;
a top plate of said high precision capacitor disposed on said capacitor dielectric layer, covering said capacitor dielectric layer on said sidewalls of said capacitor opening and covering said capacitor dielectric layer over said bottom plate in said capacitor opening; and
a capacitor planarization layer disposed in said capacitor opening over said top plate, wherein a top surface of said capacitor planarization layer and a top edge of said top plate are substantially coplanar and said top plate does not extend laterally beyond said capacitor opening, and wherein the capacitor planarization layer comprises a dielectric material, wherein:
said first dielectric layer is field oxide; and
said bottom plate includes a layer of polysilicon and a layer of metal silicide on said layer of polysilicon.

2. The integrated circuit of claim 1, wherein said bottom plate includes a metal liner disposed in a trench in said first dielectric layer and a fill metal of predominantly copper disposed on said metal liner.

3. The integrated circuit of claim 1, wherein said bottom plate includes a layer of predominantly aluminum.

4. The integrated circuit of claim 1, wherein said capacitor dielectric layer includes at least one dielectric material selected from the list consisting of silicon dioxide, silicon nitride, and silicon oxynitride.

5. The integrated circuit of claim 1, wherein said capacitor dielectric layer includes at least one dielectric material selected from the list consisting of tantalum pentoxide, zirconium oxide, and hafnium oxide.

6. The integrated circuit of claim 1, wherein said top plate includes at least one metal selected from the list consisting of titanium, titanium nitride, tantalum, tantalum nitride, titanium tungsten and tungsten.

7. The integrated circuit of claim 1, further comprising a contact through said second dielectric layer, said contact making an electrical connection to said bottom plate.

8. The integrated circuit of claim 1, further comprising a metal interconnect over said capacitor planarization layer and said second dielectric layer, said metal interconnect making an electrical connection to an edge of said top plate.

9. An integrated circuit, comprising:
a first dielectric layer;
a bottom plate of a high precision capacitor disposed over said dielectric layer;
a second dielectric layer disposed over said bottom plate and said first dielectric layer, said second dielectric layer having a capacitor opening over said bottom plate, so that said bottom plate extends past said capacitor opening on all sides;
a capacitor dielectric layer of said high precision capacitor disposed on said bottom plate in said capacitor opening and disposed on said second dielectric layer on sidewalls of said capacitor opening, extending to a top of said capacitor opening;
a top plate of said high precision capacitor disposed on said capacitor dielectric layer, covering said capacitor dielectric layer on said sidewalls of said capacitor opening and covering said capacitor dielectric layer over said bottom plate in said capacitor opening;

a capacitor planarization layer disposed in said capacitor opening over said top plate, wherein a top surface of said capacitor planarization layer and a top edge of said top plate are substantially coplanar and said top plate does not extend laterally beyond said capacitor opening; and a contact through said capacitor planarization layer, said contact making an electrical connection to said top plate;

wherein:

said first dielectric layer is field oxide; and said bottom plate includes a layer of polysilicon and a layer of metal silicide on said layer of polysilicon.

10. A method of forming an integrated circuit, comprising the steps of:

providing a first dielectric layer;

forming a bottom plate of a high precision capacitor over said first dielectric layer;

forming a second dielectric layer over said bottom plate and said first dielectric layer;

removing material from said second dielectric layer down to said top plate to form a capacitor opening in said second dielectric layer, so that said bottom plate extends past said capacitor opening on all sides;

forming a capacitor dielectric layer of said high precision capacitor over said second dielectric layer, on said bottom plate in said capacitor opening and on said second dielectric layer on sidewalls of said capacitor opening;

forming a top plate of said high precision capacitor on said capacitor dielectric layer, covering said capacitor dielectric layer over said second dielectric layer, on said sidewalls of said capacitor opening and over said bottom plate in said capacitor opening;

forming a capacitor planarization layer over said top plate over said second dielectric and in said capacitor opening, wherein the capacitor planarization layer comprises a dielectric material; and planarizing said capacitor planarization layer and said top plate so as to remove said capacitor planarization layer and said top plate adjacent to said capacitor opening, so that a top surface of said capacitor planarization layer and a top edge of said top plate are substantially coplanar and said top plate does not extend laterally beyond said capacitor opening;

wherein:

said first dielectric layer is field oxide; and said bottom plate includes a layer of polysilicon and a layer of metal silicide on said layer of polysilicon.

11. The method of claim 10, wherein said bottom plate includes a metal liner disposed in a trench in said first dielectric layer and a fill metal of predominantly copper disposed on said metal liner.

12. The method of claim 10, wherein said bottom plate includes a layer of predominantly aluminum.

13. The method of claim 10, wherein said capacitor dielectric layer includes at least one dielectric material selected from the list consisting of silicon dioxide, silicon nitride, and silicon oxynitride.

14. The method of claim 10, wherein said capacitor dielectric layer includes at least one dielectric material selected from the list consisting of tantalum pentoxide, zirconium oxide, and hafnium oxide.

15. The method of claim 10, wherein said top plate includes at least one metal selected from the list consisting of titanium, titanium nitride, tantalum, tantalum nitride, titanium tungsten and tungsten.

16. The method of claim 10, further comprising forming a contact through said second dielectric layer, said contact making an electrical connection to said bottom plate.

17. The method of claim 10, further comprising forming a metal interconnect over said capacitor planarization layer and said second dielectric layer, said metal interconnect making an electrical connection to an edge of said top plate.

18. A method of forming an integrated circuit, comprising the steps of:

providing a first dielectric layer;

forming a bottom plate of a high precision capacitor over said first dielectric layer;

forming a second dielectric layer over said bottom plate and said first dielectric layer;

removing material from said second dielectric layer down to said top plate to form a capacitor opening in said second dielectric layer, so that said bottom plate extends past said capacitor opening on all sides;

forming a capacitor dielectric layer of said high precision capacitor over said second dielectric layer, on said bottom plate in said capacitor opening and on said second dielectric layer on sidewalls of said capacitor opening;

forming a top plate of said high precision capacitor on said capacitor dielectric layer, covering said capacitor dielectric layer over said second dielectric layer, on said sidewalls of said capacitor opening and over said bottom plate in said capacitor opening;

forming a capacitor planarization layer over said top plate over said second dielectric and in said capacitor opening;

planarizing said capacitor planarization layer and said top plate so as to remove said capacitor planarization layer and said top plate adjacent to said capacitor opening, so that a top surface of said capacitor planarization layer and a top edge of said top plate are substantially coplanar and said top plate does not extend laterally beyond said capacitor opening; and forming a contact through said capacitor planarization layer, said contact making an electrical connection to said top plate;

wherein:

said first dielectric layer is field oxide; and said bottom plate includes a layer of polysilicon and a layer of metal silicide on said layer of polysilicon.

* * * * *